(12) United States Patent
O'Toole et al.

(10) Patent No.: US 9,534,950 B2
(45) Date of Patent: Jan. 3, 2017

(54) LED LIGHT SCATTERING AND ANALYSING

(71) Applicant: Feasa Enterprises Limited, Castletroy (IE)

(72) Inventors: Eamonn O'Toole, Castletroy (IE); Timothy Davern, Castletroy (IE); Michael Crowley, Castletroy (IE)

(73) Assignee: Feasa Enterprises Limited, Limerick (IE)

( * ) Notice: Subject to any disclaimer, the term of this patent is extended or adjusted under 35 U.S.C. 154(b) by 123 days.

(21) Appl. No.: 14/074,885

(22) Filed: Nov. 8, 2013

(65) Prior Publication Data

US 2014/0132958 A1    May 15, 2014

(30) Foreign Application Priority Data

Nov. 9, 2012    (GB) .................................. 1220193.5

(51) Int. Cl.
  *G01J 1/04*    (2006.01)
  *G02B 5/02*    (2006.01)
  *G01J 1/02*    (2006.01)
  *G02B 7/00*    (2006.01)
  *G01J 1/42*    (2006.01)
  *G01R 31/26*    (2014.01)

(52) U.S. Cl.
  CPC ............ *G01J 1/0407* (2013.01); *G01J 1/0242* (2013.01); *G01J 1/0271* (2013.01); *G01J 1/0437* (2013.01); *G01J 1/0448* (2013.01); *G01J 1/42* (2013.01); *G02B 5/0278* (2013.01); *G02B 7/003* (2013.01); *G01J 2001/0481* (2013.01); *G01J 2001/4247* (2013.01); *G01R 31/2635* (2013.01)

(58) Field of Classification Search
  CPC .............. G01N 21/6728; G01N 21/648; G01N 21/7703
  USPC .................................................. 356/432–448
  See application file for complete search history.

(56) References Cited

U.S. PATENT DOCUMENTS 4,120,582 A * 10/1978 De Vries ................. G01N 21/59
              356/236
4,232,971 A * 11/1980 Suga ...................... G01N 21/474
              250/228

(Continued)

FOREIGN PATENT DOCUMENTS

KR    1020120013039 A    2/2012
RU         91761 U1    2/2010
WO    WO 2009/100649 A1    8/2009

OTHER PUBLICATIONS

Search Report for Great Britain Application No. 1220193.5 dated Jan. 30, 2013.

(Continued)

*Primary Examiner* — Kara E Geisel
*Assistant Examiner* — Jarreas C Underwood
(74) *Attorney, Agent, or Firm* — Alston & Bird LLP (57) ABSTRACT

A visible LED light scattering apparatus comprising a substantially hollow spherical cavity including a light entry port arranged to receive visible light from an LED mounted outside the cavity, a light exit port located opposite the entry port and through which the LED light exits the cavity for analysis, and a baffle located in a central region of the cavity in a direct optical path between the entry port and the exit port to interrupt the passage of visible LED light between the entry and exit ports.

14 Claims, 3 Drawing Sheets

(56) References Cited

U.S. PATENT DOCUMENTS

| | | | | |
|---|---|---|---|---|
| 4,249,082 A * | 2/1981 | Kakigi | ............... | G08B 17/107 |
| | | | | 250/239 |
| 4,892,409 A * | 1/1990 | Smith | ............... | G01N 21/253 |
| | | | | 250/228 |
| 4,943,159 A * | 7/1990 | Oetliker | ............... | G01N 21/47 |
| | | | | 250/458.1 |
| 5,164,586 A * | 11/1992 | Hohberg | ............... | G01N 21/59 |
| | | | | 250/226 |
| 5,517,315 A * | 5/1996 | Snail | ............... | G01N 21/474 |
| | | | | 250/339.07 |
| 5,615,005 A * | 3/1997 | Valente | ............... | G01J 3/0251 |
| | | | | 356/30 |
| 6,120,166 A * | 9/2000 | Price | ............... | F21V 7/09 |
| | | | | 362/302 |

OTHER PUBLICATIONS

Extended European Search Report from the European Patent Application No. 13191832.8 dated Feb. 17, 2014.

Martin G et al.; *"Miniature Integrating Sphere—Silicon Detector Combination for LED Total Power Measurement"*; Measurement, Institute of Measurement and Control; London, GB; vol. 8, No. 2; Apr. 1, 1990; pp. 84-89; XP000134487.

* cited by examiner

LED LIGHT SCATTERING AND ANALYSING

CROSS-REFERENCE TO RELATED APPLICATION

This application claims priority to and the benefit of United Kingdom application no. 1220193.5, filed Nov. 9, 2012, the entire contents of which are hereby incorporated herein by reference.

FIELD

This specification relates to scattering and analysing LED light.

BACKGROUND

Testing of light output from LED's for quality control purposes is known. However, it would be desirable if the testing apparatus were better suited to the challenges associated with testing LED's.

SUMMARY

According to the invention, there is provided a LED light scattering apparatus comprising a substantially hollow spherical cavity including a light entry port arranged to receive light from an LED mounted outside the cavity, a light exit port located opposite the entry port and through which the LED light exits the cavity for analysis, and a baffle located in a central region of the cavity in a direct optical path between the entry port and the exit port to interrupt the passage of visible LED light between the entry and exit ports.

The apparatus may be configured to uniformly scatter visible LED light received from the LED before the LED light exits the cavity for analysis.

The apparatus may comprise an LED mounting location adjacent the light entry port.

An LED mounted to the mounting location may face the light entry port.

The LED mounting location, light entry port, baffle and light exit port may be aligned with one another.

The light exit port may be optically coupled to an LED light analysis apparatus.

The analysis apparatus may be configured to determine optical properties of the LED light received from the light exit port.

The cavity may comprise an internal cavity inside a body of the apparatus, and a resilient member may be configured to maintain the body in a stable spatial configuration relative to the LED.

The body may comprise a substantially cylindrical outer surface and the resilient member may comprise a sprung member located around the cylindrical surface.

The body may contain the light entry port in a first end closer to the LED mounting location and the light exit port in a second opposite end further from the LED mounting location.

The body may be mounted to a mount and the body may be moveable with respect to the mount.

The body may be located in an aperture of the mount and the body may be moveable through the aperture.

The resilient member may be configured to apply force to the mount and the body to resist vertical movement of the body with respect to the mount and an LED in the LED mounting location.

The resilient member may be configured to apply force to the mount and the body to resist lateral movement of the body with respect to the mount and an LED in the LED mounting location.

The body may be located directly above an LED in the LED mounting location during testing of the LED.

There may also be provided an LED test fixture comprising the apparatus described above.

The diameter of the cavity may be 25 mm or less, such as 20 mm or less or 15 mm or less.

The diameter of the body may be 30 mm or less, such as 25 mm or less.

There may also be provided an apparatus comprising a mount and a plurality of the LED light scattering apparatuses, wherein a body of each apparatus is mounted to the mount and the bodies are all independently moveable with respect to the mount against forces exerted by a corresponding plurality of the resilient members.

For the purposes of example only, embodiments of the invention are described below with reference to the accompanying figures in which.

BRIEF DESCRIPTION OF THE DRAWINGS

DETAILED DESCRIPTION

Figure 1:
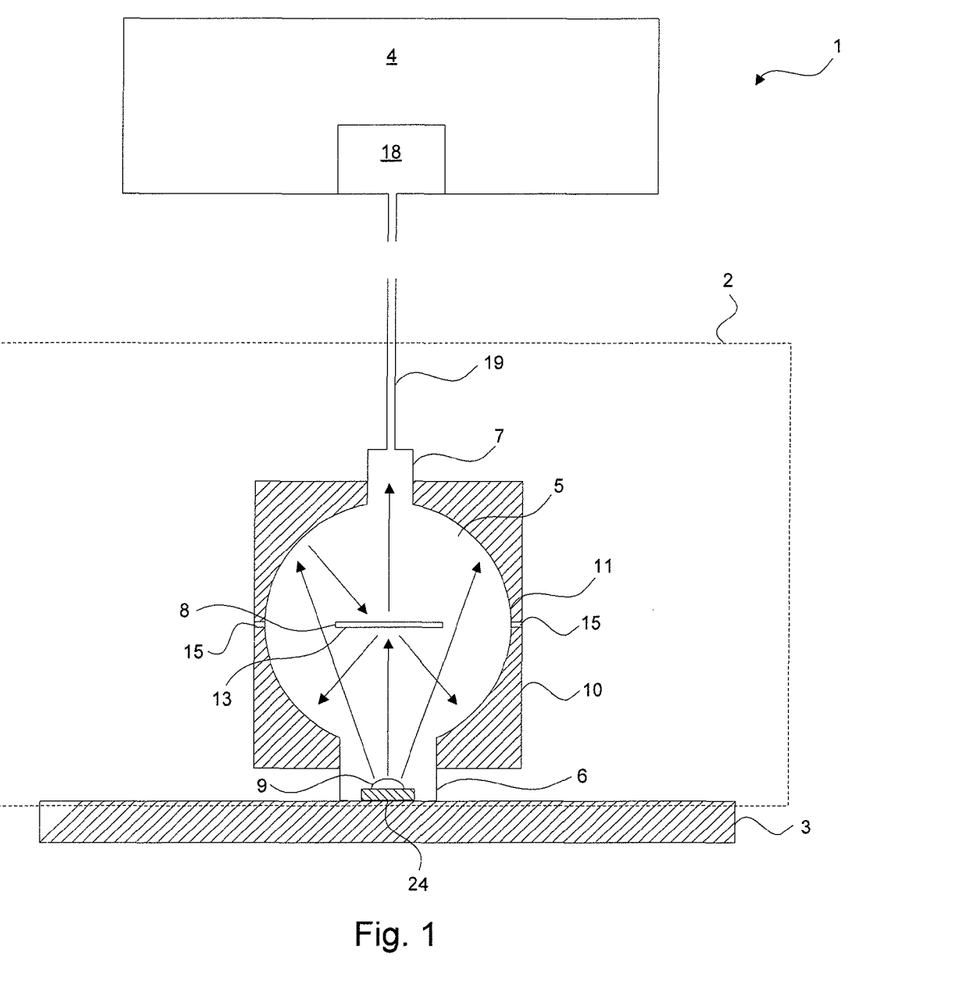
FIG. 1 is a schematic, cross-sectional illustration of an LED light scattering apparatus arranged to scatter light from an LED and to direct the scattered LED light to an analysis apparatus.

An LED testing apparatus 1 comprises an LED light scattering apparatus 2, an LED mount 3 and an LED light analysis apparatus 4. The LED mount 3 is located adjacent the LED light scattering apparatus 2 so that light emitted from LED's mounted in the mount 3 enters a substantially hollow scattering cavity 5 of the light scattering apparatus 2 through an entry port 6. The light may be visible light, but may additionally or alternatively comprise light in other regions of the EM spectrum. For example, the light may comprise light in regions of the spectrum which neighbour the visible region, i.e. infra-red light and/or ultra-violet light. The light scattering apparatus 2 is arranged to cause substantially uniform scattering of the LED light inside the cavity 5. The light analysis apparatus 4 is configured to collect the scattered LED light from an exit port 7 which is located opposite the entry port 6 of the light scattering apparatus 2, and to determine properties of the light in order to test the operation of the LED's. A baffle 8 is located in a direct optical path between the entry port 6 and the exit port 7 and thus prevents the LED light from travelling directly from LED's into the exit port 7.

An example of the LED testing apparatus 1 is illustrated in FIG. 1. As can be seen, the apparatus 1 is arranged such that an LED 9 mounted to the mount 3 faces the entry port 6 of the light scattering apparatus 2. The directional arrangement of the LED 9 relative to the entry port 6 causes it to emit substantially all of its light towards and into the entry port 6 of the scattering apparatus 2. For example, as illustrated in FIG. 1 and explained more fully further below, the LED 9 may be located partially, or substantially completely, inside the light entry port 6 of the scattering apparatus 2 during testing of the LED 9 so that substantially all light emitted by the LED 9 enters the scattering cavity 5 and is subsequently collected by the light analysis apparatus 4 via the light exit port 7.

The scattering apparatus 2 comprises a substantially cylindrical body 10, which forms the exterior of the apparatus 2. The body 10 contains the substantially spherical scattering cavity 5 and the LED light entry and exit ports 6, 7 referred to above, but may be otherwise solid. As illustrated in FIG. 1, the body 10 may comprise two halves, each containing a substantially hemispherical cavity, which are joined together to provide the enclosed substantially spherical cavity 5.

The internal cavity 5 may be formed by machining the cavity shape into a solid section of material 10. For example, if the body 10 comprises two joined half bodies 10 which each comprise a hemispherical cavity in their surface, as referred to above and shown in FIG. 1, the hemispherical cavities 5 may be machined into the half bodies 10 before the half bodies 10 and aligned are joined together to create the internal spherical cavity 5.

Referring again to FIG. 1, the light entry and exit ports 6, 7 are located in opposite end faces of the cylindrical body 10. A circumferential surface of the cylindrical body 10, which may comprise joined surfaces of the two half bodies 10 referred to above, extends between the end faces and forms a longitudinal boundary of the body 10, as will be referred to in more detail further below. The body 10 is formed of any suitable material. For example, the body 10 may be formed of a material which has a high propensity to reflect and scatter light which is incident upon it. Such materials include plastics such as Polytetrafluoroethylene (PTFE), for example Teflon®, and ceramics materials. The machined surface of these materials provides an internal light scattering surface 11 of the cavity 5, as described below.

The internal surface of the spherical cavity 5 inside the body 10 comprises a light scattering surface 11 which causes uniform scattering and diffusion of LED light through multiple scattering reflections when incident on the surface 11. The properties of the LED light which are associated with the original direction of propagation from the LED 9 are thus minimised in the cavity 5. The surface 11 comprises a diffuse material which is reflective to LED light. For example, as referred to above, the surface 11 may comprise a bare machined surface of a light reflective material from which the body 10 is formed. The visible light scattering surface 11 appears substantially white in colour.

The baffle 8 is located in a central region of the spherical cavity 5 to interrupt the direct passage of visible LED light between the entry port 6 and the exit port 7. The location of the baffle 8 is in the direct optical path between the LED 9 outside the scattering apparatus 2 and the exit port 7 through which LED light exits the scattering cavity 5. The baffle 8 thus prevents non-scattered light from the LED entering the exit port 7.

For example, as shown in FIG. 1, the baffle 8 may be located in the approximate centre of the spherical cavity 5. The location of the baffle 8 is in a direct optical path between the entry port 6, through which visible LED light enters the cavity 5, and the exit port 7, through which the light leaves the cavity 5. This prevents light travelling uninterrupted from the LED 9 into the exit port 7 and thus prevents light emitted by the LED 9 from entering the exit port 7 without first being scattered.

The baffle 8 comprises a light non-transmissive surface 13 which prevents light from the LED 9 from passing through the baffle 8 directly to the exit port 7. For example, the baffle 8 may comprise a light scattering surface 13 which reflects and scatters light from the LED 9 against the internal boundary surface 11 of the cavity 5 and thereby causes the light to be uniformly scattered inside the cavity 5 before it reaches the exit port 7. In this respect, the characteristics of the surface 13 of the baffle 8 may correspond to those of the light scattering surface 11 of the cavity 5 described previously.

Figure 2:
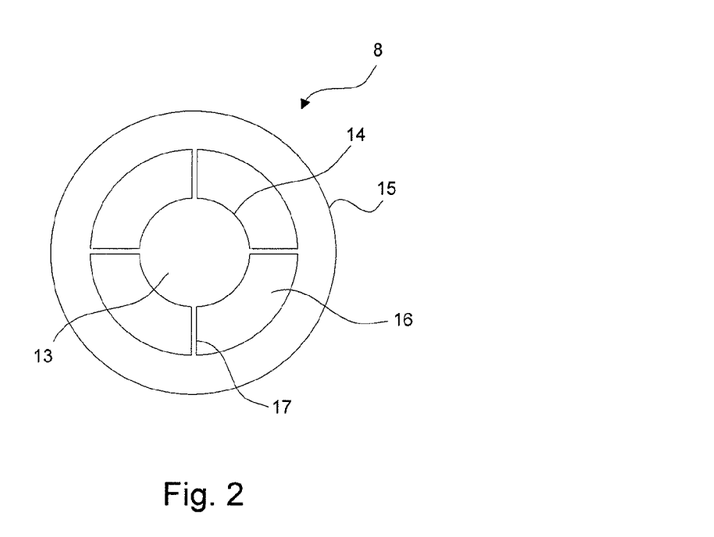
FIG. 2 is an illustration of a non-transmissive visible light baffle which is located in a direct optical path between an entry and exit of an LED light scattering cavity.

An example of the baffle 8 is illustrated in FIG. 2, which shows a view of the baffle 8 as it faces towards the LED 9 in the mount 3. As can be seen, the baffle 8 may comprise a central solid portion 14 which is positioned in the direct optical path between the entry and exit ports 6, 7 to block light from passing along the direct optical path between the LED 9 and the exit port 7. The central portion 14 may be a substantially planar shape, such as a flat shape, with its main face presented towards the LED 9. The main plane of the main face may be substantially perpendicular to the principal direction in which light propagates from the LED 9 to the baffle 8 and/or substantially parallel to the LED mount 3. For example, the central portion 14 may comprise a substantially circular disk 14, as illustrated in FIG. 2. Other shapes of central portion 8 are also possible. For example, the central portion 14 may comprise an alternative flat shape such as a pentagon, hexagon or any other n-sided polygon having three or more distinct sides.

Alternatively, the central portion 14 of the baffle 8 may comprise an n-sided pyramid having three or more distinct faces against which non-scattered light emitted from the LED 9 can be incident. The apex of the pyramid 14 is oriented towards the LED 9 and light entry port 6, so that light from the LED 9 is reflected off a surface of the pyramid 14 which is non-perpendicular to the principal propagation direction of light from the LED 9.

The baffle 8 may also comprise an outer support portion 15 surrounding the central portion 14. For example, as illustrated in FIG. 2, the outer portion 15 may comprise a substantially circular ring 15 which is of a larger diameter than the central portion 14. The outer portion 15 is fixed to the body 10 and is not located inside the cavity 5. For example, as shown in FIG. 1, the outer portion 15 may be sandwiched between the two half bodies 10 at the join between them.

The region between the central light scattering portion 14 of the baffle 8 and the outer support portion 15 comprises an LED light transmissive gap 16, which is traversed by one or more non-light-transmissive supporting sections 17. These traversing sections 17 connect the central and outer portions 14, 15 together across the gap 16 and thus support the central portion 14 of the baffle 8 in the central region of the cavity 5. The traversing sections 17 are preferably thin so as to occupy very little space in the cavity 5.

Figure 4:
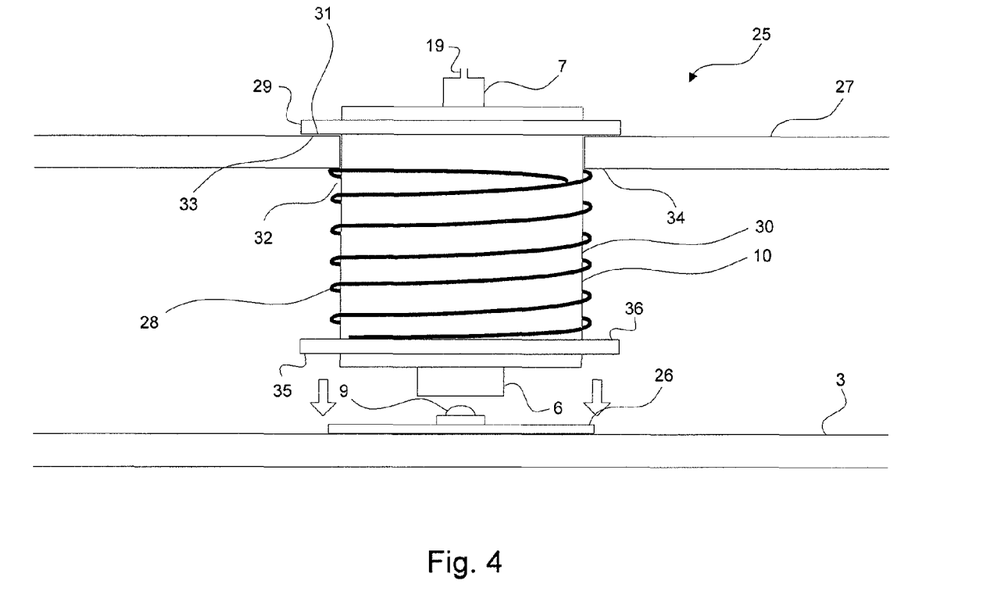
FIG. 4 is a schematic illustration of a locating mechanism for safely locating an LED light scattering apparatus in close proximity to an LED under test.
Figure 5:
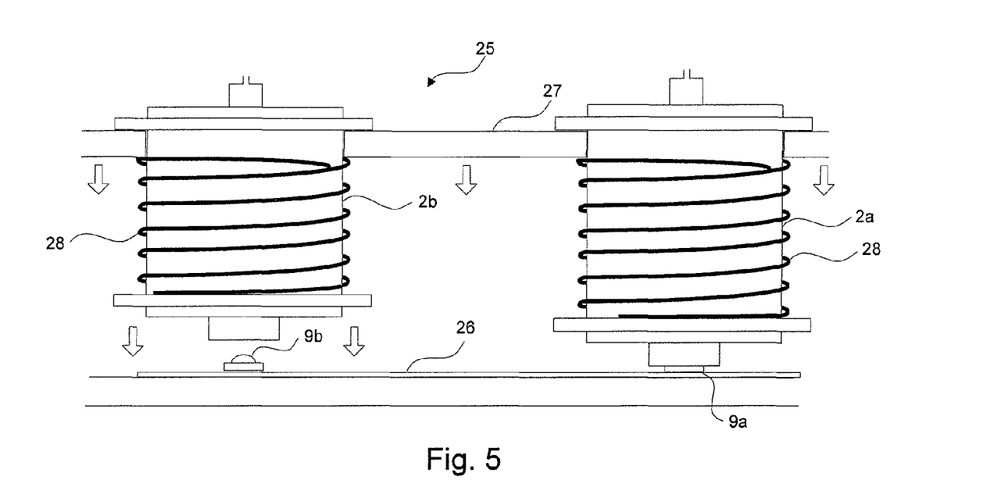
FIG. 5 is a schematic illustration of a plurality of locating mechanisms for locating a corresponding plurality of light scattering apparatuses in consistent locations relative to a plurality of LED's to be tested.

The location of the baffle 8 in the direct optical path between the entry port 6 and the exit port 7 allows the entry port 6 and exit port 7 to be located directly opposite each other whilst also causing all light from the LED 9 to be uniformly scattered before it enters the exit port 7 and analysis apparatus 4. The exit port 7 can therefore be located directly opposite the location of the LED 9 in the mount 3, which provides substantial benefits in terms of the compact arrangement of the LED light scattering apparatus 2 when used for LED testing. More specifically, the location of the light exit port 7 opposite the location of the LED 9 means that the scattered LED light is collected from a location of the body 10 which is directly opposite the LED 9 and light entry port 6. This is shown in FIGS. 1, 4 and 5. This geometric arrangement of the apparatus 2 means that the areas to the sides of the body 10 are free of light collection ports, thus allowing a plurality of light scattering apparatuses 2 to be placed side by side in very close proximity without physical interference from light collection equipment configured to channel light away from the body 10. This is advantageous because it allows a plurality of LED's 9 which are located in the very close vicinity of one another to be tested at the same time using a corresponding plurality of closely arranged light scattering apparatuses 2 positioned adjacent the LED's 9. An example of this is shown in FIG. 5.

The collection of scattered light from a face of the body 10 which is directly opposite the light entry port 6 and LED 9 also means that any light collection equipment which is connected to the light exit port 7 does not physically interfere with other electrical components in the close vicinity of the LED 9, such as relatively large capacitors on the same PCB as the LED 9. This prevents any damage which might be caused to such components by the light collection equipment and also avoids the possibility of such components obstructing the body 10 and thereby preventing it from being moved into an appropriate testing position over the LED 9.

Referring back to FIG. 1, as described above, the exit port 7 is arranged to receive LED light which has been uniformly scattered inside the cavity 5 by the light scattering surfaces 11, 13 referred to previously. The exit port 7 is configured to feed the scattered LED light into a visible light detector 18 of the light analysis apparatus 4, which as described below can be located either directly adjacent the light exit port 7 of the scattering cavity 5 or in a physically separated unit.

The exit port 7 may be optically coupled to a light detector 18 of the light analysis apparatus 4 so that scattered LED light which enters the exit port 7 from the light scattering cavity 5 travels directly to the detector 18. The exit port 7 can, for example, be optically coupled to a light guide 19, such as one or more optical fibres, which is optically coupled to the detector 18 so that scattered LED light from the cavity 5 enters the light guide 19 and is guided to the detector 18.

Alternatively, the light detector 18 of the light analysis apparatus 4 may be located directly adjacent the light exit port 7 of the scattering cavity 5 so that light which enters the exit port 7 from the cavity 5 propagates directly from the exit port 7 into the detector 18 without guidance.

The light guide 19 and light analysis apparatus 4 are examples of the light collection equipment referred to previously. Their locations are not in the vicinity of the LED 9 during testing and hence they will not interfere with positioning the scattering apparatus 2 over the LED 9.

The light detector 18 may comprise, for example, a photo-sensitive transducer 18 which is configured to determine optical properties of scattered LED light incident on a light receiving surface of the detector 18 and to generate electrical signals which describe the optical properties of the light. The detector 18 may, for example, comprise a spectrometer or similar apparatus which is configured to determine the optical properties of the LED light. The detector 18 may, for example, be configured to determine the total power of the LED 9 under test from the scattered light. The determination of total power can be made accurately due to the original propagation direction of the light, which is associated with the output characteristics of the LED 9, having been destroyed in the scattering cavity 5. Examples of other optical properties which may be determined by the detector 18 include the luminous flux, for example in lumens, the frequency(ies) and/or wavelength(s) (e.g. peak wavelength) and the spectrum of the LED light. The determination of luminous flux provides a measure of the total amount of visible light emitted by the LED 9 under test.

Figure 3:
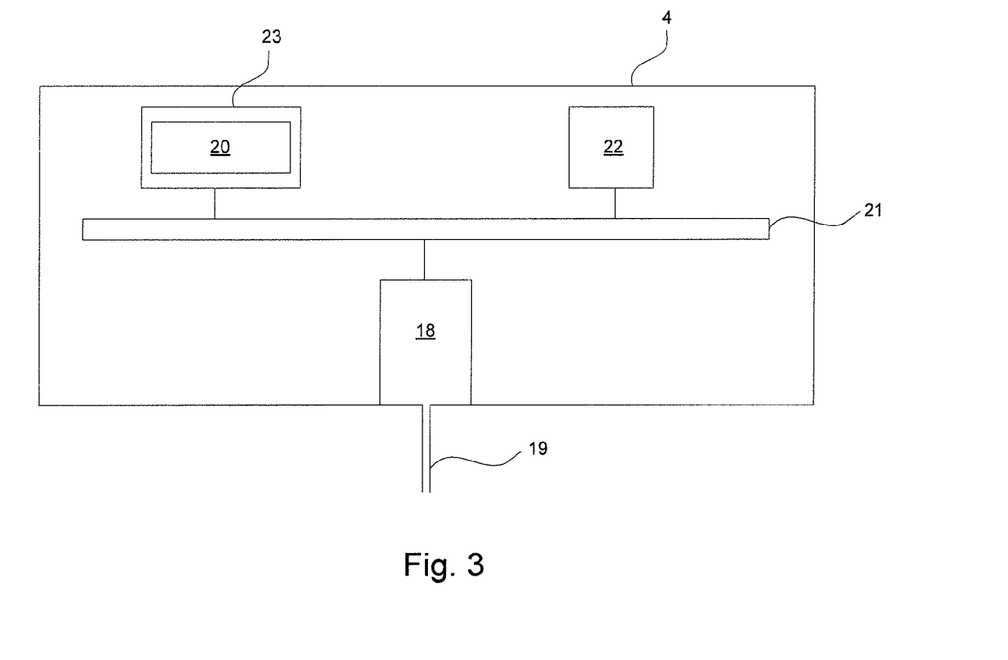
FIG. 3 is a schematic diagram of an LED light analysis apparatus which is configured to receive scattered LED light from an LED light scattering apparatus.

Referring to FIG. 3, the detector 18 may be communicatively coupled to other elements of the light analysis apparatus 4, such as a display screen or another type of signal output 20, by a suitable communication coupling 21 such as a computer bus or other electronic circuitry in order to facilitate transmission of the signals generated in the detector 18 for analysis and/or display.

The light analysis apparatus 4 may be configured to determine whether the properties of the scattered LED light, for example as determined by the detector 18, are within ranges of acceptable test values. The test values may be pre-stored in a memory 22 of the apparatus 4. The values may be input by a user through a user interface 23 of the apparatus 4 and/or determined dynamically by the apparatus 4 based on previous measurements of LED light, such as light from LED's which were known to be operating correctly.

Referring to FIG. 4, the body 10 which contains the scattering cavity 5 of the LED light scattering apparatus 2 is moveable to a location which is directly adjacent, for example directly over, an LED test position 24 on the LED mount 3. Therefore, during testing of an LED 9, the LED 9 is located directly adjacent, such as directly beneath, the body 10. The light emitting surface of the LED 9 faces towards the end face of the body 10 in which the light entry port 6 referred to previously is located. The LED 9 is aligned with the light entry port 6 so that the light which is emitted by the LED 9 enters the scattering cavity 5 through the entry port 6. More particularly, as previously described with respect to FIG. 1, the LED 9 may in fact be located at least partially inside the light entry port 6 so that the light entry port 6 surrounds the light emitting surface of the LED 9. This ensures that substantially all light emitted by the LED enters the light scattering cavity 5 via the entry port 6.

A support mechanism 25 is configured to allow the body to of the scattering apparatus 2 to be safely moved into very close proximity to the LED 9, for example so that the LED 9 is inside the light entry port 6, without risking damage to the LED 9 by contact with the body 10. For example, the mechanism 25 is configured to prevent damage to the LED 9 and body 10 due to unintended forceful contact between the two during movement of the body 10 towards the LED 9 in apparatus set-up. If the LED is electrically coupled to a printed circuit board (PCB) 26 as shown in FIGS. 4 and 5, the support mechanism 25 also prevents damage being caused to the PCB 26 by contact with the body 10.

The support mechanism 25 is configured to automatically provide consistency of position of the scattering apparatus 2 relative to the LED 9 from which it is collecting light. The mechanism 25 always locates the body 10 in the same location relative to the LED 9 and thus provides for consistently repeatable testing conditions without the need for fine manual adjustments in the position of the body 10. This is particularly advantageous where a plurality of scattering apparatuses 2 are to be moved into position over a plurality of LED's 9, as described below and shown in FIG. 5. The support mechanism 25 comprises a mount 27, such as a mounting plate 27, which supports the body 10 of the scattering apparatus 2 above the LED 9, and a resilient member 28 which is coupled between the mount 27 and the body 10 of the scattering apparatus 2. In the event that the body 10 contacts the LED 9 or PCB 26, for example during positioning of the body 10 over the LED 9 before a test, the body is able to move relative to its mount 27 to prevent damage to the PCB 26 or LED 9. The resilient member 28 is configured to contract and thereby maintain the body 10 in a stable location relative to the PCB 26 and LED 9.

The contraction of the resilient member 28 also allows other neighbouring scattering apparatuses 2, which are mounted to the same mount 27, to be lowered (or otherwise moved) further into position over neighbouring LED's 9 without causing damage to the LED's 9 or the PCB 26 to which they are mounted. For example, if the mount 27 to which the scattering apparatuses 2 are mounted is uneven, meaning that movement of the mount 27 towards the LED's 9 does not result in the plurality of scattering apparatuses 2 all simultaneously contacting the PCB 26, the resilient members 28 around the bodies 10 of the scattering apparatuses 2 are configured to contract until all scattering apparatuses 2 have been moved into the required testing position. This position may comprise contact between the body 10 and the PCB 26 to which the LED's are mounted, as shown in FIGS. 4 and 5. In such circumstances, the relative position of the scattering apparatuses 2 relative to the LED's 9 is consistent across all pairs of scattering apparatuses 2 and LED's 9, meaning that the testing of the plurality of LED's 9 can be carried out under the same conditions.

An example of this is illustrated in FIG. 5. In FIG. 5, a plurality of scattering apparatuses 2a, 2b are being moved into location over a corresponding plurality of LED's 9a, 9b on a PCB 26. The first scattering apparatus 2a is about to contact the PCB 26 over its LED 9a but the second scattering apparatus 2b is further away from the PCB 26 and is thus in a different position relative to its LED 9b than the first scattering apparatus 2a. This may be due to small differences between the scattering apparatuses 2a, 2b, variations in the surface of the PCB and/or variations in the mount 27. Such differences and variations may, for example, be due to manufacturing tolerances or other similar factors.

In order to move the second scattering apparatus 2b into the desired testing position over its LED 9b and thus provide a position which is consistent with that of the first scattering apparatus 2a, the mount 27 is moved closer to the PCB 26. This further movement of the mount 27 causes the mount 27 to exert a force against the resilient member 28 around the first scattering apparatus 2a and thus causes the resilient member 28 to contract following contact between the first scattering apparatus 2a and the PCB 26. The load placed on the resilient member 28 by the mount 27 causes the resilient member 28 to press the first scattering apparatus 2a against the surface of the PCB 26 and thereby maintain the first scattering apparatus 2a in position over its LED 9a whilst the second scattering apparatus 2b is moved into position.

Subsequent contact between the second scattering apparatus 2b and the PCB 26 causes a corresponding contraction in the resilient member 28 around the second scattering apparatus 2b and has the corresponding effect of maintaining the second scattering apparatus 2b in the same relative location as its neighbour 2a. The position of both scattering apparatuses 2a, 2b with respect to the LED's 9a, 9b is thus consistent and repeatable.

The support mechanism 25 is described below in detail with respect to FIG. 4.

The body 10 of the scattering apparatus 2 may comprise a projection 29 which interacts with the mount 27 of the support mechanism 25 in order to support the body 10 above the LED 9. The projection 29 extends outwards from the circumferential, or otherwise longitudinal and/or substantially vertical, surface 30 of the body 10 in order to provide at least one contact surface 31 against which a force, such as a vertically upwards force, can be applied to support and/or resist movement of the body 10 relative to the LED 9. For example, as explained below and shown in FIG. 4, such a supporting force may be applied by the mount 27. The contact surface(s) 31 of the projection 29 may extend at an angle which is approximately parallel to the principal plane of the mount 27 and/or approximately perpendicular to the longitudinal surface 30 of the body 10.

An example of such a support projection 29 comprises a collar 29 which extends around the longitudinal surface 30 of the body 10, as shown in FIG. 4.

The mount 27 of the support mechanism 25 comprises an aperture 32 which allows the body 10 of the scattering apparatus 2 to move through the mount 27. The aperture 32 may, for example, comprise a substantially circular aperture in the mount 27, with a diameter slightly larger than the external diameter of the substantially cylindrical body 10 referred to previously. This allows the body 10 to move freely through the aperture 32, as referred to previously, without any substantially sized gap between the two.

The support projection 29 has a transverse dimension which is larger than that of the aperture 32 and which therefore prevents the projection 29 from moving through the mount 27. As shown in FIG. 4, the support projection 29 is located on an opposite side of the mount 27 to the location of the LED 9 and therefore limits the degree to which the body 10 can move towards the LED 9 without movement of the mount 27. More specifically, contact between the contact surface 31 of the projection 29 and a corresponding (e.g. upper) contact surface 33 of the mount 27 around the aperture 32 prevents the projection 29 from passing through the aperture 32 and thus prevents further travel of the body 10 through the aperture 32 towards the LED 9.

The resilient member 28 is located on the opposite side of the mount 27 to the support projection 29. The member 28 is coupled between a (e.g. lower) contact surface 34 of the mount 27, which faces the LED 9, and a fixed location on the body 10 closer to the LED 9. For example, the fixed location may be provided by another projection 35, such as a second collar 35, which extends outwardly from the circumferential, or otherwise longitudinal, surface 30 of the body 10. This second projection 35 is located on an opposite side of the mount 27 to the first projection 29 and on the same side of the mount 27 as the LED 9. The lower contact surface 34 of the mount 27 and the second projection 35 together provide surfaces against which the resilient member 28 can exert forces under compression and thereby maintain the body 10 in a position over an LED 9 whilst also preventing damage to the LED 9 and body 10.

The second projection 35 comprises at least one contact surface 36 against which a force, such as a vertically downwards force, can be applied to support and/or resist movement of the body 10 relative to the LED 9. The contact surface(s) 36 may extend at an angle which is approximately perpendicular to the longitudinal surface 30 of the body 10 and/or which is approximately parallel to the mount 27.

The transverse dimension of the second projection 35 is larger than that of the aperture 32 and therefore, as with the first projection 29, the second projection 35 cannot move through the mount 27. Contact between the contact surface 36 of the second projection 35 and the lower contact surface 34 of the mount 27 which faces it would prevent the projection 35 from passing through the aperture 32 and thus would also prevent further travel of the body 10 through the aperture 32. For example, in a situation where the body 10 makes contact with the LED 9 or PCB 26, contact between the second projection 35 and the mount 27 would prevent further travel of the body 10 through the mount 27.

The resilient member 28 is located between the mount 27 and the second projection (or other fixed location) 35 of the body 10 and is configured to resist movement of the second projection 35, and thereby also the light entry port 6, towards the mount 27. This resistive action of the resilient member 28 contributes towards maintenance of a stable spatial configuration of the body 10 relative to the mount 27 and the LED 9.

For example, as shown in FIG. 4, the resilient member 28 may comprise a sprung member such as a coil spring 28. The resilient member 28 may be located on or around the longitudinal surface 30 of the body 10 of the scattering apparatus 2 between the mount 27 and the second projection 35 of the body 10. In an equilibrium state of the resilient member 28, the member 28 contributes to the maintenance of an equilibrium spatial position of the body 10 relative to the mount 27 by resisting movement from the equilibrium position. This equilibrium spatial position may comprise a position in which the first projection 29 of the body 10 rests against the upper contact surface 33 of the mount 27, as shown in FIG. 4. This position comprises the maximum possible distance between the mount 27 and the second projection 35 and the maximum extent of travel of the body 10 towards the LED 9 relative to the mount 27.

If a force is applied to the body 10 either laterally or vertically, for example due to contact between the body 10 and the LED 9 or PCB 26 whilst positioning the mount 27 during apparatus set-up, the resilient member 28 is configured to cause the body 10 to press against the PCB 26 and/or LED 9 and thereby maintain a stable arrangement of the body 10 relative to the LED 9. For example, if an upwards force were applied to the body 10 so as to move the body 10 through the aperture 32 and thereby reduce the distance between the mount 27 and the second projection 35, the resilient member 28 would resist the movement and thereby maintain contact between the body 10 and the PCB 26 to which the LED 9 is mounted. This scenario may occur if the mount 27 to which the scattering apparatus 2 is mounted is still being moved closer to the PCB 26 in order to move the bodies 10 of neighbouring scattering apparatuses 2 (also mounted to the mount) into contact with the PCB at other locations, as shown in FIG. 5.

Arrangement of the resilient member 28 around the longitudinal surface 29 of the body 10 also supports the body 10 in an approximately perpendicular spatial relationship with the mount 27 and the light emitting face of the LED 9. This prevents the body 10 from tipping or slipping on the surface of LED 9 or PCB 26 and thus prevents the damage that such movement may cause.

As described above, the arrangement of the scattering apparatus 2 allows a plurality of the scattering apparatuses 2 to be mounted in very close proximity to one another on the same mount 27. For example, a plurality of the scattering apparatuses 2 may be mounted to the mount 27 in a grid, or other pattern, in which the apparatuses 2 are touching or otherwise very closely arranged relative to each other. The arrangement of the scattering apparatuses 2 on the mount 27 allows the plurality of apparatuses 2 to be moved simultaneously into a testing position over a corresponding plurality of closely arranged LED's 9 on a PCB 26. An example is a group of LED's 9 which together form a light source such as a light for a vehicle.

The support mechanisms 25 which support each scattering apparatus 2 in the mount 27 allow movement in the scattering apparatuses 2 relative to the mount 27 if the scattering apparatuses 2 contact the PCB 26, and thus allow all scattering apparatuses 2 to be moved into the same position relative to their corresponding LED 9 even if there are inconsistencies in the mount 27 and or PCB 26 which mean that not all scattering apparatuses 2 contact the PCB 26 simultaneously.

The outside diameter of the substantially cylindrical body 10 described above may be any value between approximately 10 mm and 30 mm, such as between approximately 12 mm and 28 mm. Specific examples within this range include approximately 25.0 mm and approximately 16.0 mm.

The diameter of the internal scattering cavity 5 may be between approximately 5 mm and 25 mm, such as between approximately 15 mm and 20 mm. Specific examples within this range include approximately 19.0 mm and approximately 12.0 mm. These specific examples correspond with the specific examples of outside diameters given above.

The diameter or otherwise transverse dimension of the inlet port 6 may be between approximately 3 mm and approximately 15 mm, such as between approximately 5 mm and approximately 12 mm, although it will be appreciated that the dimension can be varied so as to accommodate the size of the LED's being tested. Specific examples within this range include approximately 6.0 mm, approximately 8.0 mm and approximately 10.0 mm.

The length of body 10 may be between approximately 25 mm and 60 mm, such as between approximately 30 mm and 50 mm. Specific examples within this range include approximately 43 mm and approximately 34 mm.

Examples outside of the ranges given above could alternatively be used.

The alternatives described above can be used either singly or in combination to achieve the effects of the invention. It will be appreciated that alternatives to the specific components described in the detailed examples could be used to achieve the same effects without departing from the scope of the claims.

The invention claimed is:

1. An apparatus comprising a mount and a plurality of LED light scattering apparatuses, each LED light scattering apparatus comprising a body, said body comprising a substantially hollow spherical cavity including a light entry port arranged to receive visible light from an LED mounted outside the cavity, a light exit port located opposite the entry port and through which the LED light exits the cavity for analysis, and a baffle located in a central region of the cavity in a direct optical path between the entry port and the exit port to interrupt the passage of visible LED light between the entry and exit ports, wherein each LED light scattering apparatus further comprises a resilient member which is caused to contract by movement of the LED light scattering apparatus towards the LED, and wherein the body of each LED light scattering apparatus is mounted to the mount and the bodies are all independently moveable with respect to the mount against forces exerted by the corresponding plurality of resilient members.

2. An apparatus according to claim 1, wherein at least one of the LED light scattering apparatuses is configured to uniformly scatter visible LED light received from the LED before the LED light exits the cavity for analysis.

3. An apparatus according to claim 1, at least one of the LED light scattering apparatuses comprising an LED mounting location adjacent the light entry port.

4. An apparatus according to claim 3, wherein an LED mounted to the mounting location faces the light entry port of the at least one of the LED light scattering apparatuses and is at least partially surrounded by the light entry port of said at least one of the LED light scattering apparatuses during testing of the LED.

5. An apparatus according to claim 3, wherein the LED mounting location, light entry port, baffle and light exit port of the at least one of the LED light scattering apparatuses are aligned with one another.

6. An apparatus according to claim 1, wherein the light exit port of at least one of the LED light scattering apparatuses is optically coupled to an LED light analysis apparatus.

7. An apparatus according to claim 6, wherein the analysis apparatus is configured to determine optical properties of the LED light received from the light exit port.

8. An apparatus according to claim 1, wherein the cavity of at least one of the LED light scattering apparatuses comprises an internal cavity inside the body of the LED light scattering apparatus and wherein the resilient member is configured to maintain the body in a stable spatial configuration relative to the LED.

9. An apparatus according to claim 8, wherein the body comprises a substantially cylindrical outer surface and the resilient member comprises a sprung member located around the cylindrical surface.

10. An apparatus according to claim 8, wherein the body contains the light entry port in a first end closer to the LED mounting location and the light exit port in a second opposite end further from the LED mounting location.

11. An apparatus according to claim 8, wherein the body is located in an aperture of the mount and wherein the body is moveable through the aperture.

12. An apparatus according to claim 8, wherein the resilient member is configured to apply force to the mount and the body to resist vertical movement of the body with respect to the mount and an LED in the LED mounting location.

13. An apparatus according to claim 8, wherein the resilient member is configured to apply force to the mount and the body to resist lateral movement of the body with respect to the mount and an LED in the LED mounting location.

14. An apparatus according to claim 8, wherein the body is located directly above an LED in the LED mounting location during testing of the LED.

* * * * *